(12) United States Patent
Sun et al.

(10) Patent No.: US 10,885,970 B2
(45) Date of Patent: Jan. 5, 2021

(54) NON-LINEAR ACTIVATION FOR SENSING CIRCUITRY

(71) Applicant: Micron Technology, Inc., Boise, ID (US)

(72) Inventors: Honglin Sun, Boise, ID (US); Glen E. Hush, Boise, ID (US); Richard C. Murphy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 33 days.

(21) Appl. No.: 16/117,594

(22) Filed: Aug. 30, 2018

(65) Prior Publication Data

US 2020/0075080 A1 Mar. 5, 2020

(51) Int. Cl.
*G11C 11/4091* (2006.01)
*G06F 3/06* (2006.01)

(52) U.S. Cl.
CPC ........ *G11C 11/4091* (2013.01); *G06F 3/0604* (2013.01); *G06F 3/0659* (2013.01); *G06F 3/0673* (2013.01)

(58) Field of Classification Search
CPC .................................................. G11C 11/4091
See application file for complete search history.

(56) References Cited

U.S. PATENT DOCUMENTS

| | | | |
|---|---|---|---|
| 4,839,735 A | 6/1989 | Kyomasu et al. | |
| 2003/0169622 A1 | 9/2003 | Ooishi et al. | |
| 2010/0232229 A1 | 9/2010 | Ogawa et al. | |
| 2012/0036315 A1* | 2/2012 | Reohr ................. | G11C 7/1045 711/105 |
| 2013/0155798 A1* | 6/2013 | Kajigaya ............... | G11C 7/065 365/208 |
| 2017/0316833 A1* | 11/2017 | Ihm ....................... | G11C 16/28 |

* cited by examiner

*Primary Examiner* — Jay W. Radke
(74) *Attorney, Agent, or Firm* — Brooks, Cameron & Huebsch, PLLC

(57) ABSTRACT

Systems, apparatuses, and methods related to processing operations in a memory array are described. Sensing circuitry within a memory array may, for example, employ a non-linear activation function to perform certain operations, including processing or basic processing functions. A memory array can include multiple cells each coupled to respective sense lines and select lines. Sensing circuitry of the array may receive a charge from each of the cells via the sense lines and determine whether an aggregate charge of the is greater than a threshold. The sensing circuitry may then take certain actions, or refrain from taking certain actions depending on whether the aggregate charge is greater or less than the threshold. A non-linear reference voltage may be employed to manage or implement the non-linear activation function.

23 Claims, 6 Drawing Sheets

NON-LINEAR ACTIVATION FOR SENSING CIRCUITRY

TECHNICAL FIELD

The present disclosure relates generally to semiconductor memory and methods and, more particularly, to systems, apparatuses, and methods related to processing operations in a memory array.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations. Processing exclusively at a host device or central processing unit (CPU) may be inefficient or unsuitable for certain applications.

DETAILED DESCRIPTION

Figure 1:
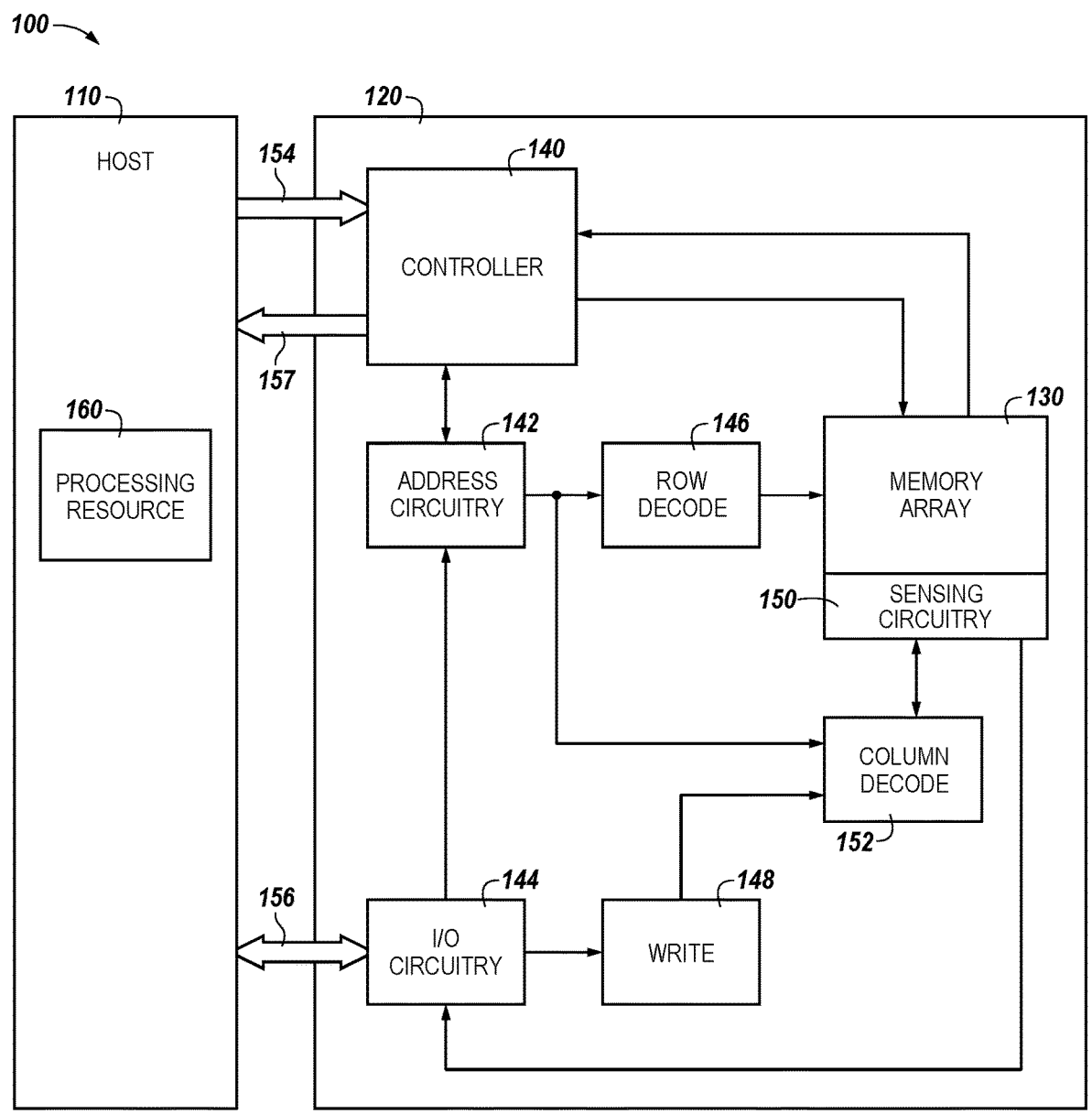
FIG. 1 is a block diagram of an apparatus in the form of a computing system including a memory device in accordance with a number of embodiments of the present disclosure.

The present disclosure includes systems, apparatuses, and methods related to processing in memory, including implementing a non-linear activation function in sensing circuitry. Implementing one or more processing resources in a memory system can include the introduction of logic to perform processing operation in the memory system. Introducing logic to perform processing operation in the memory system can add to the cost and the size of the memory system.

However, it may be desirable to perform processing operations in the memory system without introducing new logic to the memory system. For example, it may be helpful to perform processing operations in the sensing circuitry of a memory system. Processing operations may be performed in sensing circuitry without requiring additional logic (e.g., additional sense amplifiers, among other types of logic) to compute functions.

Processing operations can be implemented in sensing circuitry by utilizing a non-linear activation function in the sensing circuitry. A non-linear activation function can also be referred to as a conditional activation function. Compute functions can include operations that generate an output from one or more inputs. A sense amplifier utilizing a non-linear activation function can determine whether a charge is equal to, greater than, or less than a threshold.

The non-linear activation function can provide the ability to compare charges in a sense amplifier. The comparison of charges in the sense amplifier can be used to activate the sensing circuitry. An activation of the sensing circuitry can include an activation of the sense amplifier. The sense amplifier can provide a charge responsive to an activation of the sense amplifier. An activation of the sense amplifier can be non-linear due to the use of a non-linear reference voltage. The reference voltage can be referred to as non-linear because the reference voltage can change as dictated by a controller and/or a host. For example, a sense amplifier can be activated at a first time if a charge stored in a latch of the sense amplifier is greater than or equal to a first threshold. The sense amplifier can also be activated at a different time if a charge stored in the latch of the sense amplifier is greater than or equal to a second threshold where the first threshold is not equal to the second threshold. In some examples, comparison operations utilizing non-linear activation functions can be used in the context of machine learning.

By way of example, a number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a memory device, in which a processor may be implemented internally and near to a memory (e.g., directly on a same chip as the memory array). A processor in a memory device may save time by reducing and eliminating external communications and may also conserve power.

Dynamic random-access memory (DRAM) may be provided as part of a computing system to store data associated with the computing system. The non-linear activation function can be implemented in the sensing circuitry of a memory system comprising DRAM. In some approaches, DRAM may comprise multiple one transistor, one capacitor (1T1C) memory cells, which may be coupled together to form a memory array. In 1T1C DRAM environments, binary data information may be stored in the capacitor in the form of an electric charge. Once a 1T1C memory cell has been read (e.g., once a read operation has been performed using data stored in the 1T1C memory cell), the electric charge corresponding to the binary data information stored in the capacitor may discharge (e.g., leak, become depleted, etc.) thereby destroying the information that was stored in the capacitor. This phenomenon may be referred to as a "destructive read" or "destructive memory cell read."

In contrast, DRAM memory cells having three transistors (3T) may preserve the binary data information (e.g., may preserve the charge stored therein) subsequent to performance of a read operation. This may allow for multiple word lines (e.g., read row lines, write row lines, etc.) to be fired without the need to refresh the memory cells or re-write data to the memory cells subsequent to performance of a read operation. This may reduce power consumption of a memory device since the memory cells do not need to be re-written or refreshed in comparison to conventional 1T1C DRAM memory cells, and may reduce an amount of time (e.g., a read-to-read delay) required between performance of read operations in comparison to conventional 1T1C DRAM memory cells.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n, "N," etc., particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 350 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, memory array 130, and/or sensing circuitry 150 might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a processing resource 160 (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array (e.g., a 3T DRAM array), SRAM array, STT RAM array, PCRAM array, TRAM array, RRAM array, NAND flash array, NOR flash array, and/or 3D XPoint, for instance. The array 130 can comprise memory cells arranged in rows coupled by select lines, which may be referred to herein as row lines, access lines, or word lines, and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.). In some embodiments, the memory array may include the sensing circuitry 150 in addition to the memory cells arranged in rows coupled by word lines and columns coupled by digit lines.

The memory device 120 includes address circuitry 142 to latch address signals for data provided over a data bus 156 (e.g., an I/O bus) through I/O circuitry 144. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

Controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC), field programmable gate array, etc. The controller 140 can control, for example, performance of logical operations between operands stored in the memory array 130.

As described further below, in a number of embodiments, the sensing circuitry 150 and/or the array 130 can comprise one or more sense amplifiers and/or a logical operation component. The sense amplifier(s) can be used in the performance of compute functions. For example, the sense amplifiers may be used to perform logical operations such as AND, OR, XOR, NOR, NAND, (e.g., logical operation between operands stored in the sense amplifier(s)). Embodiments are not so limited, however, and in some embodiments, the sense amplifiers may be configured to latch data values based on the reference voltages (e.g., trip points) of the sense amplifiers. The sense amplifiers can also be configured to perform comparison operations based on a reference voltage (e.g., trip point) of the sense amplifiers. The comparison operations can be used in machine learning to perform compute functions including logical operations.

For example, the sense amplifiers can aggregate one or more charges in a latch. The sense amplifier can determine whether the aggregated charge is greater than a threshold utilizing a reference voltage.

In a number of embodiments, the sensing circuitry 150 can be used to perform compute functions using data stored in array 130 as inputs and/or store the results of the logical operations back to the array 130 without transferring data via a digit line address access (e.g., without firing a column decode signal). As such, various compute functions can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140, processing resource 160 or elsewhere)). Stated alternatively, various compute functions may be performed using, and within, the sensing circuitry 150 without transferring data or commands to or from the host 110.

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform compute functions on data stored in memory array 130 and store the result back to the memory array 130 without enabling an I/O line (e.g., a local I/O line) coupled to the sensing circuitry 150. The sensing circuitry 150 can be formed on pitch with the memory cells of the array.

In a number of embodiments, circuitry external to array 130 and sensing circuitry 150 is not needed to perform compute functions as the sensing circuitry 150 can perform the appropriate logical operations to perform such compute functions without the use of an external processing resource.

Therefore, the sensing circuitry 150 may be used to complement and/or to replace, at least to some extent, such an external processing resource (or at least the bandwidth consumption of such an external processing resource).

However, in a number of embodiments, the sensing circuitry 150 may be used to perform compute functions (e.g., to execute instructions) in addition to logical operations performed by an external processing resource (e.g., host 110 and/or processing resource 160). For instance, host 110 and/or sensing circuitry 150 may be limited to performing only certain compute functions and/or a certain number of compute functions including logical operations.

Enabling an I/O line can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without firing column decode signals. Whether or not local I/O lines are used in association with performing logical operations via sensing circuitry 150, the local I/O line(s) may be enabled in order to transfer a result to a suitable location other than back to the array 130 (e.g., to an external register).

Figure 2:
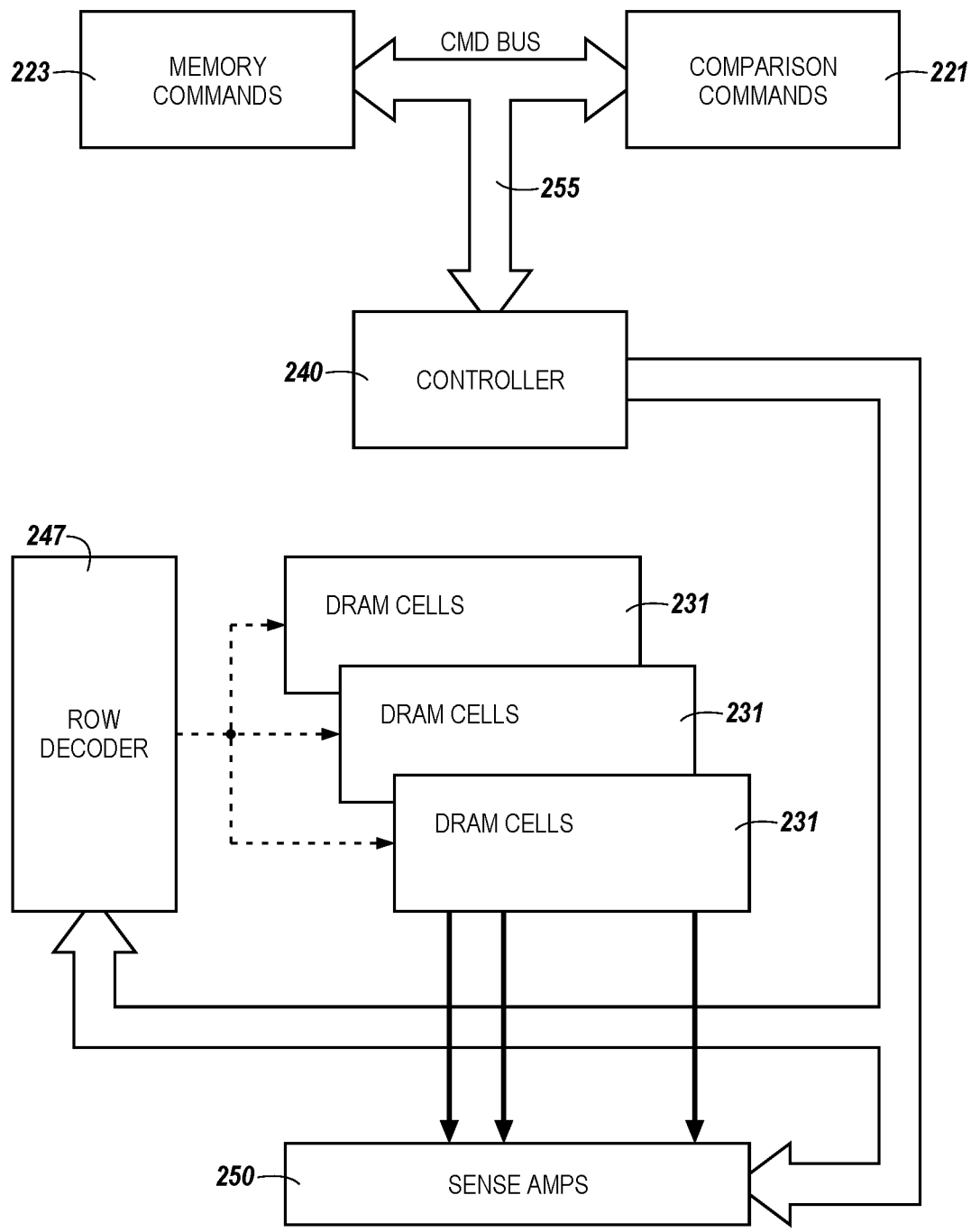
FIG. 2 is a block diagram of an apparatus in the form of a memory device in accordance with a number of embodiments of the present disclosure.

FIG. 2 is a block diagram of an apparatus in the form of a memory device in accordance with a number of embodiments of the present disclosure. The memory device includes the memory cells 231, the controller 240, the row controller 247, and the sense amplifier 250.

The controller 240 can receive commands via command bus 255 from a host and/or from a different processing resource. The commands received from the controller 240 can include memory commands 233 and/or comparison commands 221. Conventional commands 233 include read commands and/or write commands. Comparison commands 221 can include commands to perform comparison operations in the sensing circuitry utilizing a non-linear activation function implemented using one or more reference voltages.

In some examples, the comparison commands 221 can include commands other than commands for performing a comparison operation. For example, the comparison commands 221 can include commands for utilizing comparison operations to perform compute functions. The comparison commands 221 can include an order for performing a plurality of comparison operations in the memory array, among other types of information.

The comparison commands 221 can comprise one or more memory addresses corresponding to memory cells that store charges. The comparison commands 221 can define an order associated with the memory cells. For example, the comparison commands 221 can define an order of activation for the select lines and/or sense line to which the memory cells are coupled. The order can include a duration of time associated with the activation of each of the select lines and/or sense lines.

The comparison commands 221 can include a duration of time independent of an order of activation for the select lines and/or the sense line to which the memory cells are coupled. The duration of time can define a time between the receipt of the comparison commands 221 at the controller 240 and the processing of the comparison commands 221. The duration of time can allow charges to be stored in the memory cells coupled to the select lines and/or the sense lines. The duration of time can also provide a time for the charges stored in the memory cells to leak. The duration of time provides a time for the storing of charges before the charges are compared to a threshold.

The duration of time can be associated with a rate of charge leakage corresponding to the memory cells. The duration of time can be associated with a time dependent dielectric constant relaxation corresponding to the memory cells.

A rate of charge leakage can include the release of electric charge from one or more capacitors corresponding to memory cells of an array. A time dependent dielectric constant relaxation is the momentary delay in the dielectric constant of a material. The delay can be caused by a molecular polarization with respect to a changing electric field in a dielectric medium.

As such, the duration of times provides a time for charges to be stored in the memory cells and for the charges to leak before the aggregate charges are compared to a threshold. The time at which the charges are stored in the memory cells and the duration for which the charges are stored in the memory cells can contribute to the magnitude of the aggregate charges. For instance, a first charge having a given magnitude stored in a memory cell at a first time can have half the magnitude upon aggregating the first charge with other charges. Accordingly, the comparison operation can have a time dependent component corresponding to the duration of time, a time at which the charges are stored in the memory cells, a time at which the aggregation takes place, and a time at which the comparison takes place.

In some examples, the comparison commands 221 can also include a selection of one or more reference voltages that can be used to compare the stored charges to a threshold. The reference voltage can also be referred to as a bias voltage. The bias voltage can be compared with the charges corresponding to the memory cells to determine whether the charges corresponding to the memory cells are greater than a threshold.

In some instances, a host can provide comparison commands 221 to memory device. The memory device can receive the comparison commands 221 at a controller 240. The controller 240 can provide the reference voltage, can select an order of activation of the memory cells, and/or can select a duration of time for activating the memory cells, among other configurations used to perform the comparison commands.

The comparison commands 221 can include the memory commands 223 and/or can be associated with the memory commands 223. For example, a write command can be provided by the host to prepare the memory cells 231 for subsequent compare commands. A write command can store charges in the memory cells which can then be aggregated in the sense amplifiers 250 to determine whether the aggregated charges are greater than a threshold to implement the non-linear activation function.

The controller 240 can control the sense amplifiers 250, a row decoder 247, and/or a column decoder to implement a non-linear activation function in the sense amplifiers 250. The row decoder 247 can activate one or more select lines concurrently. The column decoders can activate one or more sense lines concurrently. Activating select lines and/or sense lines concurrently can include activating the select lines and/or the sense lines during a same duration of time even if the select lines and/or the sense lines are not initially activated at a same time.

For example, the controller 240 can activate select lines concurrently by activating a first select line at a first time and a second select line at a second time and by deactivating the first select line and the second select line at a third time. The first select line and the second select line are concurrently activated from the second time to the third time even if the second select line is not activated while the first select line is activated from the first time to the second time. The select lines can be initially activated at a same time if the first select line and the second select line are activated from a first time to a second time.

By activating, through the row decoder 247 and a column decoder, the plurality of select lines and sense lines, the controller can activate a plurality of memory cells 231 of an array. In some examples, the memory cells 231 are coupled to a same sense line and a plurality of select lines. For example, a first memory cell can be coupled to a sense line and to a first select line, a second memory cell can be coupled to the sense line and a second select line, and the third memory cell can be coupled to the sense line and a third select line.

The sense amplifiers can receive the charges stored in the memory cells 231 responsive to the activation of the memory cells 231. The charges can be aggregated. For example, a first charge stored in a first memory cell, a second charge stored in a second memory cell, and a third charge stored in a third memory cell can be aggregated. The aggregating of charges can include storing the plurality of charges supplied by the memory cells 231 in a latch of a corresponding sense amplifier of the sense amplifiers 250. A sense amplifier can correspond to the plurality of memory cells if the sense amplifier is coupled to same sense line to which the plurality of memory cells is coupled.

In some examples, the memory commands 223 and the comparison commands 221 are provided via the same command bus 255. In other examples, the memory commands 223 are provided through the command bus 255 while the comparison commands 221 are provided through a sideband channel. The sideband channel can include a bus separate from the command bus 255 and/or data buses, among other types of buses.

Figure 3A:
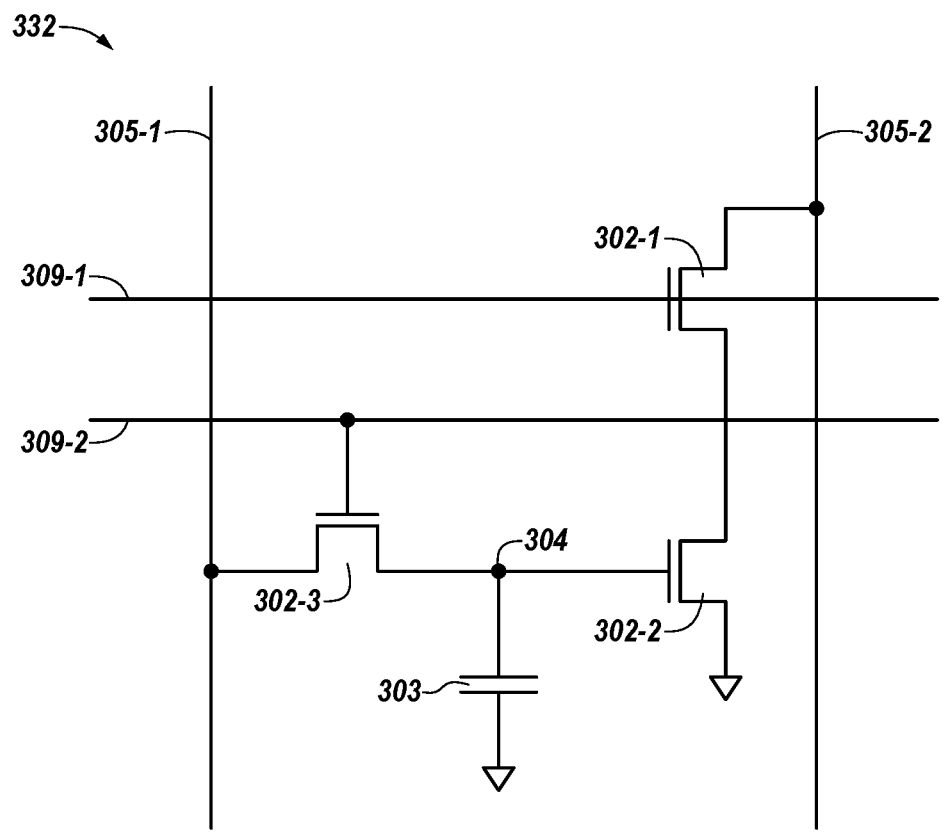
FIG. 3A is a schematic drawing illustrating a portion of a memory array in accordance with a number of embodiments of the present disclosure.

FIG. 3A is a schematic drawing illustrating a portion of a memory array in accordance with a number of embodiments of the present disclosure. FIG. 3A illustrates one memory cell 332, which can be one of a number of memory cells corresponding to memory array 130 shown in FIG. 1. In the example shown in FIG. 3, the memory cell 332 is a 3T DRAM memory cell. However, in other examples, the memory cell 332 can be a different DRAM memory cell or memory cell associated with a different memory architecture (e.g., SRAM array, STT RAM array, PCRAM array, TRAM array, RRAM array, NAND flash array, NOR flash array, and/or 3D XPoint, among others). For example, the memory cells 332 can be 1T1C (i.e., one transistor one capacitor) memory cells each comprises an access device (e.g., transistor) and a storage element (e.g., a capacitor). In a number of embodiments, the memory cells may be destructive read memory cells (e.g., reading the data stored in the cell destroys the data such that the data originally stored in the cell is refreshed after being read).

In this example, the memory cell 332 comprises three transistors 302-1, 302-2, and 302-3. The memory cell 332 may be operated to store a data value (e.g., a stored charge at node 304). In some embodiments, a charge associated with the data value may be stored at node 304 using the parasitic capacitance generated between transistor 302-3 and transistor 302-2. Embodiments are not so limited however, and the memory cell 332 may optionally include a discrete capacitor 303 to store the data value.

The memory cell 332 includes two word lines 309-1/309-2 (e.g., row lines/sense lines) and two digit lines 305-1/305-2 (e.g., bit lines/sense lines). Word line 309-1 may be referred to herein as a read row line, and the word line 309-2 may be referred to herein as a write row line. Digit line 305-1 may be referred to herein as a write digit line, and digit line 305-2 may be referred to herein as a read digit line. The word lines 309-1/309-2 and the digit lines 305-1/305-2 may be enabled and/or disabled in conjunction with reading and writing data to the node 304 of the memory cell 332.

As shown in FIG. 3A, the transistors 302-1, 302-2, and 302-3 are coupled to the word lines 309-1/309-2 and digit lines 305-1/305-2. In association with performing a write operation, the write row line 309-2 may be enabled, and data (e.g., charge) may be placed on the write digit line 305-1, thereby causing the data to be stored at node 304. Similarly, in association with performing a read operation, the read row line 309-1 may be enabled and the data represented by a charge stored on the node 304 may be transferred onto via the read digit line 305-2. In some embodiments, the data value read out of the memory cell 332 as part of a read operation may be inverted in comparison to the data value written to the memory cell 332 as part of the write operation. For example, if a value of "1" is written to the memory cell 332, a value of "0" may be read out of the memory cell 332. Conversely, if a value of "0" is written to the memory cell 332, a value of "1" may be read out of the memory cell 332.

For example, memory cell 332 can be coupled to different digit lines 305-1/305-2 and word lines 309-1/309-2. For instance, in this example, a first source/drain region of transistor 302-3 is coupled to digit line 305-1, a second source/drain region of transistor 302-3 is coupled to node 304, and a gate of transistor 302-3 is coupled to word line 309-2. A first source/drain region of transistor 302-1 is coupled to digit line 305-2, a second source/drain region of transistor 302-1 is coupled to a first source/drain region of transistor 302-2, and a gate of transistor 302-1 is coupled to word line 309-1.

In some embodiments, the charge stored at node 304 of the memory cell 332 may be used as an operand for the performance of a comparison operation. For example, a charge stored at node 304 can be used as an operator with a charge stored at a different node of a different memory cell. For example, the data value corresponding to a charge stored at node 304 of the memory cell 332 may be transferred to a sense amplifier and subsequently used as an operand to perform a comparison operation with a data value corresponding to a charge stored at node 304 of a different memory cell and transferred to the same sense amplifier.

In some embodiments, the memory cell 332 may be controlled to store a data value at node 304 subsequent to performance of a read operation. For example, the memory cell 332 may be controlled such that read operations are non-destructive. This may allow for multiple rows (e.g., read rows) to be fired without refreshing or re-writing data to the memory cell 332, which may allow for improved performance and reduced power consumption in comparison with previous approaches that utilize destructive read cells such as 1T1C memory cells.

Although schematically represented in a planar orientation, the transistors 302-1, 302-2, and/or 302-3 may be arranged in a vertical orientation (e.g., extending upward out of the page or downward into the page in FIG. 3A). In some embodiments, the transistors 302-1, 302-2, and/or 302-3 of the memory cell 332 may be formed such that the transistors 302-1, 302-2, and/or 302-3 are contained within an area defined by the digit lines 305-1/305-2. For example, the transistors 302-1, 302-2, and/or 302-3 of the memory cell 332 may be formed on pitch with digit lines 305-1/305-2 of the memory cell 332. In some embodiments, the memory cell 232 may be formed such that the transistors 302-1, 302-2, and/or 302-3 of the memory cell 332 are disposed within an area that is equal to or less than an area used by a conventional 1T1C DRAM memory cell.

Figure 3B:
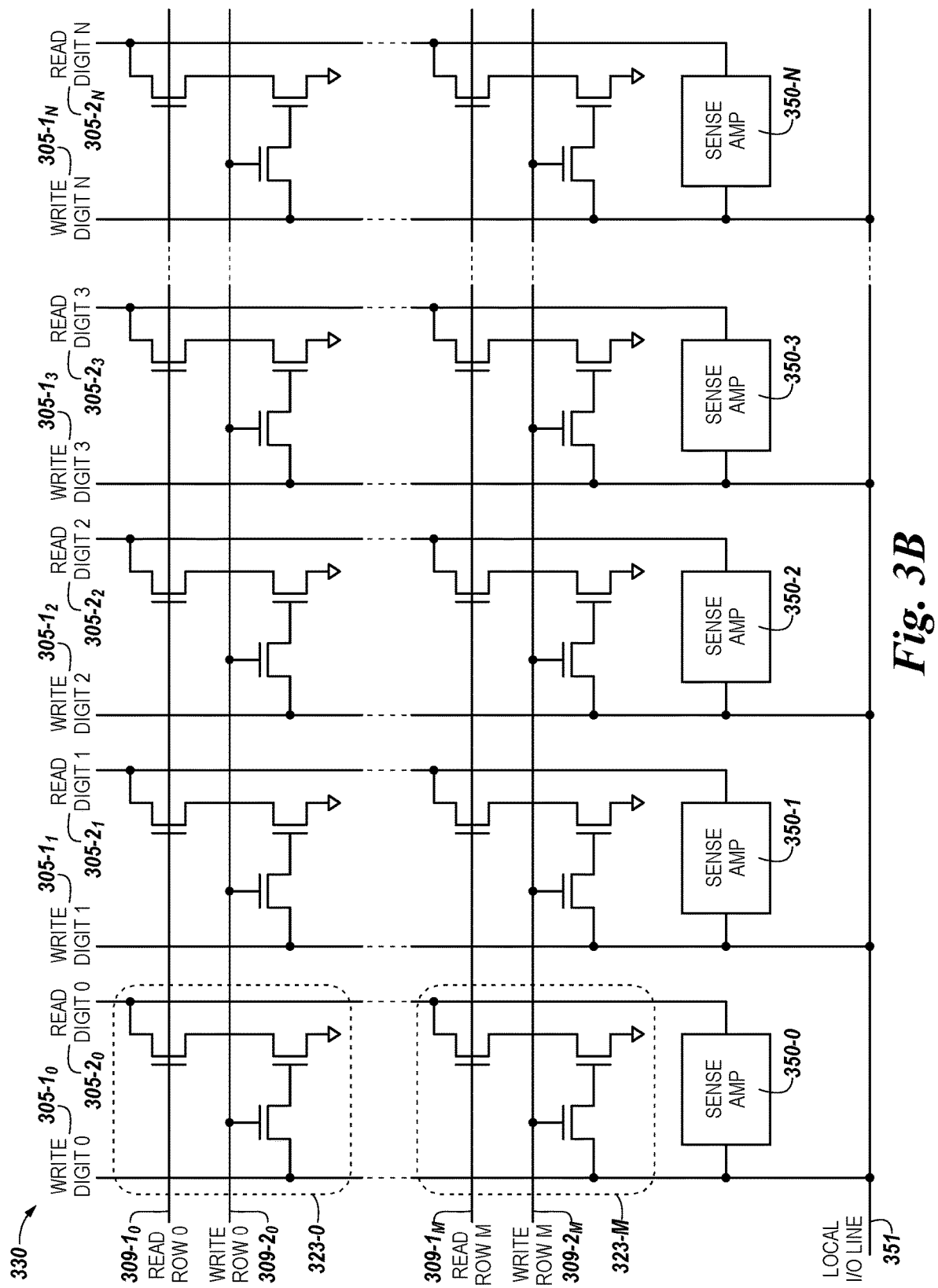
FIG. 3B is another schematic drawing illustrating a portion of a memory array in accordance with a number of embodiments of the present disclosure.

FIG. 3B is another schematic drawing illustrating a portion of a memory array 330 in accordance with a number of embodiments of the present disclosure. As shown in FIG. 3B, the memory array 330 comprises memory cells 332-0 to 332-M, referred to as memory cells 332. For clarity, only two memory cells 332-0 and 332-M are labeled in FIG. 3B; however, each set of three transistors illustrated in FIG. 3B represents one of a plurality of memory cells 332 associated with the memory array 330. FIG. 3B also shows the sense amplifiers 350-0, 350-1, 350-2, 350-3, . . . , 350-N, referred to generally as sense amplifiers 350.

The plurality of memory cells 332 are coupled to a plurality of digit lines 305 and row lines 309. For example, the memory cell 332-0 is coupled to digit lines $305\text{-}1_0/305\text{-}2_0$ (e.g., write digit0 line $305\text{-}1_0$ and read digit0 line $305\text{-}2_0$) and row lines $309\text{-}1_0/309\text{-}2_0$ (e.g., read row0 line $309\text{-}1_0$ and write row0 line $309\text{-}2_0$). Similarly, a memory cell 332-1 is coupled to digit lines $305\text{-}1_0/305\text{-}2_0$ (e.g., write digit0 line $305\text{-}1_0$ and read digit0 line $305\text{-}2_0$) and row lines $309\text{-}1_1/309\text{-}2_1$ (e.g., read row1 line $309\text{-}1_1$ and write row1 line $309\text{-}2_1$), . . . , and a memory cell 332-M (e.g., not shown) is coupled to digit lines $305\text{-}1_0/305\text{-}2_0$ (e.g., write digit0 line $305\text{-}1_0$ and read digit0 line $305\text{-}2_0$) and word lines $309\text{-}1_M/309\text{-}2_M$ (e.g., read rowM line $309\text{-}1_M$ and write rowM line $309\text{-}2_M$).

In some embodiments, if one or more memory cells 332 coupled to a particular digit line $305\text{-}2_0$, . . . , $305\text{-}2_N$ (e.g., if one or more memory cells in a particular column of memory cells) contains a high voltage (e.g., a logical value of "1"), the associated digit line $305\text{-}2_0$, . . . , $305\text{-}2_N$ will be driven to a ground reference potential. For example, if memory cell 332 (or any other memory cell in the column of memory cells coupled to digit line $305\text{-}2_0$) contains a high voltage, digit line $305\text{-}2_0$ will be driven to a ground reference potential.

As described in more detail in association with FIG. 3, herein, the sense amplifiers 350 are coupled to respective pairs of digit lines $305\text{-}1_0$, . . . , $305\text{-}1_N$ and $305\text{-}2_0$, . . . , $305\text{-}2_N$. The sense amplifier may sense a low voltage (e.g., a logical value of "0") if one or more of the memory cells coupled to a same pair of digit lines $305\text{-}1_0$, . . . , $305\text{-}1_N$ and $305\text{-}2_0$, . . . , $305\text{-}2_N$ that are also coupled to the sense amplifier contains a high voltage (e.g., a logical value of "1"). Conversely, the sense amplifier may sense a high voltage (e.g., a logical value of "1") if one or more of the memory cells coupled to a same pair of digit lines $305\text{-}1_0$, . . . , $305\text{-}1_N$ and $305\text{-}2_0$, . . . , $305\text{-}2_N$ that are also coupled to the sense amplifier contains a low voltage (e.g., a logical value of "0"). That is, in some embodiments, the sense amplifiers 350 may sense a particular value (e.g., a "1" or a "0") based on the value stored in the one or more memory cells that are coupled thereto.

As mentioned above, because a read operation using the memory cell(s) 332 described in FIGS. 3A and 3B may be non-destructive, the memory cell(s) 332 may still contain the original data value (e.g., the same high or low voltage) that was stored therein prior to performance of the read operation and/or performance of the logical operation, while the sense amplifier may contain a result of the logical operation after performance of the logical operation. In some embodiments, the data value (e.g., the logical value of "0" or "1") stored in the sense amplifier subsequent to performance of the logical operation may be written back to any of the memory cells 332 (or row of memory cells) in the memory array 330.

Although the examples described herein provide charges as digital charges, the charges stored in the memory cells 332 can also store analog charges. As used herein, an analog charge comprises a value from a plurality of values based on the magnitude of the analog charge. For example, an analog charge can comprise data describing a value from three or more possible values. For example, the analog charge can be a first data value, a second data value, a third data value, or a fourth data value. A digital charge can comprise a value from two possible values based on the magnitude of the digital charge. For example, the digital charge can comprise data describing a value from two possible values (e.g., 0 or 1). The analog charge can be a first data value or a second data value.

The examples provided herein comprise the aggregation of charges in a sense amplifier of an array. Other examples can include the concurrent aggregation of charges in a plurality of sense amplifiers. For example, a plurality of the sense amplifiers 350 can aggregate a charge to perform N compare operations utilizing one or more non-linear activation functions. The sense amplifier 350-0 can perform a first comparison operation and the sense amplifier 350-1 can perform a second comparison operation. The first comparison operation can utilize a first non-linear activation function and the second comparison operation can utilize the first non-linear activation function or a second non-linear activation function. The first non-linear activation function can utilize a first reference voltage and the second non-linear activation function can utilize a second reference voltage.

In some embodiments, a controller can be configured to control a sensing circuitry comprising the sense amplifiers 350 to receive a first charge from the memory cell 332-0 via the pair of complimentary sense lines $305\text{-}1_0$ and $305\text{-}2_0$. The sensing circuitry can also be configured to receive a second charge from the memory cell 332-M via the pair of complimentary sense lines $305\text{-}1_0$ and $305\text{-}2_0$. The controller can also be configured to control the sensing circuitry to determine whether an aggregate charge of the first charge and the second charge is greater than a threshold. The charges can be aggregated as described in FIG. 4.

Responsive to determining that the aggregate charge is greater than the threshold, the controller can be configured to control the sensing circuitry to provide a third charge. Responsive to determining that the aggregate charge is not greater than the threshold, the controller can be configured to refrain from providing the third charge.

The memory array and/or a memory device comprising the memory array can be DRAM. In examples implemented using 3D XPoint memory, the sensing circuitry can aggregate resistance. Resistance can be aggregated by measuring the combined resistance of one or more memory cells. The measured resistances can comprise data such that the sensing circuitry can determine whether the combined resistance is greater than a threshold controlled through a reference voltage. In other examples, the memory array can and/or memory device can be a different type of memory such as SRAM, among others.

The third charge can be provided from the sensing circuitry. As used herein, actions performed by the sensing circuitry can be directed by the controller. For example, the controller can control the sensing circuitry (e.g., the sense amplifier 350-0, for example) to provide the third charge. The third charge can be the aggregated charge. In some examples, the third charge can be a charge greater than or less than the aggregated charge.

In some instances, the sensing circuitry can provide the third charge through the local I/O line 351. For example, the sensing circuitry can provide the third charge to the controller and/or a host. In examples where the host provides the comparison command, the sensing circuitry can provide the third charge to the host. The sensing circuitry can also provide the third charge to a different memory array, block, memory device, and/or memory system. For instance, the sensing circuitry can provide the third charge to a different bank where the results of the comparison operation can be utilized by the different bank. The different bank can be a bank that is different from the bank which includes the array 230 and/or the sense amplifiers 350.

The sensing circuitry can also provide the third charge by shifting the third charge between sense amplifiers 350. For example, the sense amplifier 350-0 can shift the third charge to one or more of the other sense amplifiers 350-1 to 350-N. The sense amplifiers 350 can shift the third charge using shifting circuitry not shown.

The sensing circuitry can further provide the third charge to the memory cells 323. The controller can cause the third charge to be stored in the memory cells 323. The third charge can be stored in memory cells 323-0 to 323-M which are coupled to complimentary digit lines $305\text{-}1_0$ and $305\text{-}2_0$, where the sense amplifier 350-0 is also coupled to complimentary digit lines $305\text{-}1_0$ and $305\text{-}2_0$. For example, the third charge can be stored in the memory cells 323-0 and 323-1 which are coupled to the digit lines $305\text{-}1_0$ and $305\text{-}2_0$ and the row lines $309\text{-}1_0$ and $309\text{-}2_0$ and the row lines $309\text{-}1_1$ and $309\text{-}2_1$. The third charge can also be stored in memory cells coupled to the digit lines $305\text{-}1_0$ and $305\text{-}2_0$ and the row lines $309\text{-}1_2$ and $309\text{-}2_2$ to the row lines $309\text{-}1_M$ and $309\text{-}2_M$. The controller can also cause the third charge to be stored in memory cells which are coupled to complimentary digit lines $305\text{-}1_1$ and $305\text{-}2_1$ to $305\text{-}1_N$ and $305\text{-}2_N$.

In some embodiments, a controller can be configured to cause the sense amplifier 350-0 to receive the first charge and a second charge. The first charge can be received from a memory cell coupled to a digit line (e.g., complimentary digit lines $305\text{-}1_0$ and $305\text{-}2_0$) to which the sense amplifier 350-0 is coupled. For example, the first charge can be received from the memory cell 323-0 which is coupled to digit lines $305\text{-}1_0$ and $305\text{-}2_0$.

In some examples, the controller is further configured to cause the sense amplifier 350-0 to receive the second charge from a memory cell coupled to one of the digit lines $305\text{-}1_1$ and $305\text{-}2_1$ to $305\text{-}1_N$ and $305\text{-}2_N$ and one of the complimentary row lines $309\text{-}1_0$ and $309\text{-}2_0$ to $309\text{-}1_M$ to $309\text{-}2_M$. For example, a second sense amplifier can receive the charge, where the second sense amplifier is coupled to a same digit line as to which the memory cell providing the charge is coupled. The controller can shift the charge from the second sense amplifier to the sense amplifier 350-0.

That is, the second charge can be received from one of the sense amplifiers 350-1 to 350-N. The second sense amplifier can provide the charge to the sense amplifier 350-0 at a same time as the activation of a digit line corresponding to a column of the second sense amplifier. For example, a digit line (e.g., complimentary digit lines $305\text{-}1_1$ and $305\text{-}2_1$) and a row line (e.g., complimentary row lines $309\text{-}1_0$ to $309\text{-}2_0$) of a memory cells providing the charge can be activated in concurrence with the activation of the shifting circuitry to move the charge from the memory cell to the second sense amplifier and from the second sense amplifier to the sense amplifier 350-0.

The second charge can also be received from the controller and/or the host. For example, the second charge can be received at a controller from a host and the controller can provide the second charge to the sense amplifier 350-0. The second charge can also be received from a different bank and/or a memory device.

Figure 4:
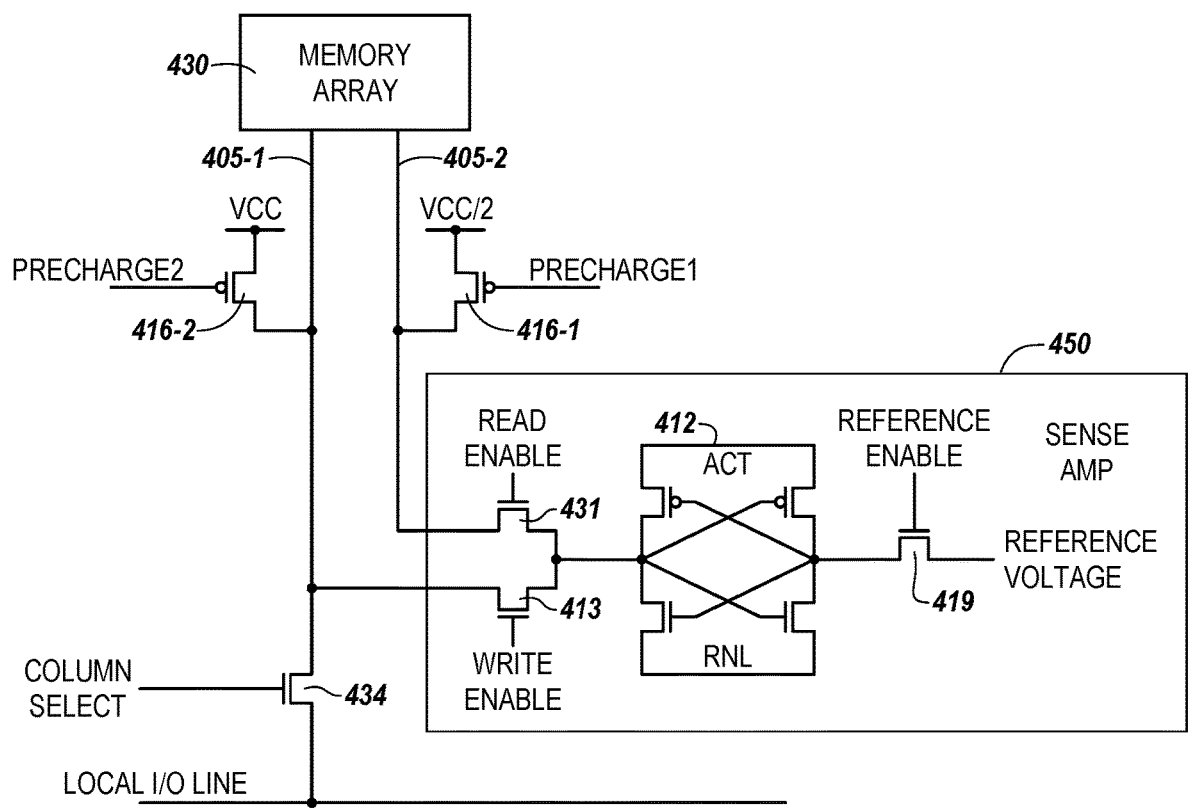
FIG. 4 is a schematic diagram illustrating sensing circuitry having a logical operation component in accordance with a number of embodiments of the present disclosure.

FIG. 4 is a schematic diagram illustrating sensing circuitry having a logical operation component in accordance with a number of embodiments of the present disclosure. FIG. 4 includes the memory array 430 and the sense amplifier 406. FIG. 4 illustrates a single sense amplifier 450 for ease of reference. However, multiple sense amplifiers can be coupled to the memory array 430 such that each column of the memory array 430 is coupled to a different sense amplifier.

The sense amplifier may receive a reference voltage. The reference voltage may refer to a voltage at which at least one memory cell associated with the sense amplifier is conducting. For example, the sense amplifier 450 may be configured to have a reference voltage corresponding to a first voltage.

The sense amplifier 406 may be activated. The sense amplifier(s) may have a reference voltage (e.g., a trip point) somewhere between a pair of rail voltages (e.g., a supply voltage Vcc and a GND voltage).

For example, upon activation (e.g., upon enabling) of the sense amplifier 450, the sense amplifier 450 may have a reference voltage somewhere in between $V_{cc}$ and a ground voltage. Two row lines can be activated concurrently. When two row lines are activated, there may be, in a digital charge example, three different possible charges accumulated at the sense amplifier 405. A first aggregate charge with a smallest magnitude can correspond to the values (0,0) being stored at the memory cells. A second aggregate charge with a next smallest magnitude can correspond to the values (0,1) or (1,0) being stored at the memory cells. A third aggregate charge with a greatest magnitude can correspond to the values (1,1) being stored in the memory cells. A reference voltage can be selected to provide distinguish the different states (e.g., different aggregated charges) of the memory cells. For example, a reference voltage can be selected such that the first charge is below the reference voltage and the second and third charges are above the reference voltage.

The read digit line 405-2 may be coupled to a first source/drain region of a transistor 416-1 (e.g., Precharge1 transistor 416-1). A second source/drain region of the transistor 416-1 may be coupled to a voltage source configured to provide $V_{cc}/2$ to the second source/drain region of the transistor 416-1. The write digit line 405-1 may be coupled to a first source/drain region of a transistor 416-2 (e.g., Precharge2 transistor 416-2). A second source/drain region of the transistor 416-2 may be coupled to a voltage source configured to provide $V_{cc}$ to the second source/drain region of the transistor 416-2.

The read digit line 405-2 and the write digit line 405-1 may be coupled to the sensing circuitry 450, a Column Select transistor 434, and/or a Local input/output (I/O) line. The Column Select transistor 434 may be controlled to select various columns of the memory array 430 to, for example, allow data values to be transferred between the memory array 430 and the sensing circuitry 450 and/or to circuitry external to the memory array 430. In some embodiments, the Local I/O line may be controlled to transfer data values from the memory array 430 and/or sensing circuitry 450 to circuitry external to the memory array 430.

As used in FIG. 4, the sensing circuitry 450 can also be referred to as the sense amplifier 450. The sense amplifiers 450 can be operated to determine a data value (e.g., logic state) stored in a selected memory cell of the memory array 430. The sense amplifier 450 can include a cross-coupled latch 412 (e.g., gates of a pair of transistors, such as n-channel transistors that are cross coupled with the gates of another pair of transistors, such as p-channel transistors); however, embodiments are not limited to this example. The cross-coupled latch 412 may be coupled to a Read Enable transistor 431-1, which may be coupled to the read digit line 405-2 and a Write Enable transistor 413-1, which may be coupled to the write digit line 405-1.

The sense amplifier 450 may further include a Reference Enable transistor 419, which may be coupled to the cross-coupled latch 412 at a first source/drain region of the transistor 419. In some embodiments, a second source/drain region of the transistor 419 may be coupled to a reference potential (e.g., a ground reference potential).

In some embodiments, the comparison operation as described above may be performed between an aggregation of the charges stored in the memory array 430 by precharging the ACT (active pull-up) node of the cross-coupled latch 412 of the sense amplifier 450 and/or precharging the RNL (activation) node of the cross-coupled latch 412 of the sense amplifier 450. In some embodiments, the ACT node or the RNL node, may be precharged to $V_{cc}/2$ prior to performance of the compare operation.

Subsequent to, or concurrently with precharging the ACT node and the RNL node, the Precharge1 transistor 416-1 may be enabled to precharge the read digit line 405-2 to $V_{cc}/2$. In some embodiments, the Read Enable transistor 431 may be enabled such that the charge on the digit line 405-2 may pass through the Read Enable transistor 431. Subsequently, the Reference Enable transistor 419 may be enabled.

A plurality of rows may be subsequently activated (e.g., opened). In some embodiments, two rows, such as write row0 and write row1 may be activated. The rows may be activated to allow data values stored in the corresponding memory cells to be transferred to the sense amplifiers 406.

In some embodiments, the data values stored in memory cells coupled to the rows (e.g., row0 and row1) may be sensed by the sense amplifier 450. For example, a signal may develop on the sense amplifier 450 in response to activation of the rows. Once the signal has developed on the sense amplifier 450, the Reference Enable transistor 419 may be disabled, and/or the Read Enable transistor 431 may be disabled.

The ACT node and/or the RNL node may subsequently be enabled (e.g., fired) to sense a state corresponding to the read digit line 405-2. For example, the ACT node and/or the RNL node may subsequently be enabled to sense the data values present on the read digit line 405-2 in the sense amplifier 450.

In some embodiments, once the data values are sensed by the sense amplifier 450, the rows may be deactivated (e.g., closed). In some embodiments, the write digit line 405-1 may be precharged to $V_{cc}$. For example, the Precharge2 transistor 416-2 may be enabled to precharge the write digit line 405-1 to $V_{cc}$. Subsequently, a row may be activated. For example, write rowN may be activated (e.g., opened).

The Reference Enable transistor 419 can be activated to compare a reference voltage to an accumulated voltage stored in the latch 412. The latch 412 can accumulate a charge. However, accumulated a charge can also include accumulating a voltage. The accumulated voltage can be compared to the reference voltage by activating the Reference Enable transistor 419. As such, the reference voltage can provide a threshold to which the accumulated charge is compared.

Figure 5:
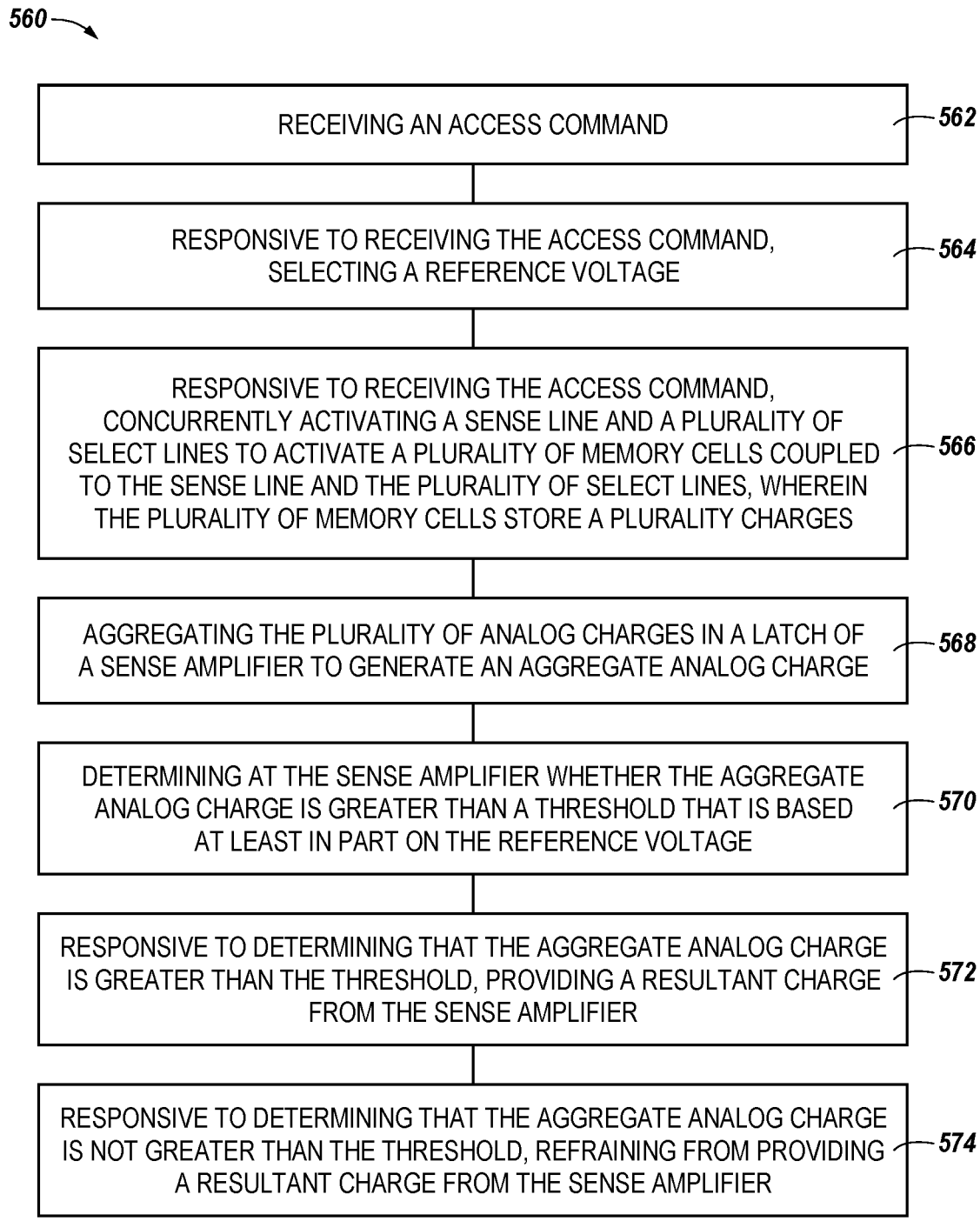
FIG. 5 is a flow diagram for implementing a non-linear activation function in sensing circuitry in accordance with a number of embodiments of the present disclosure.

FIG. 5 is a flow diagram 560 for implementing a non-linear activation function in sensing circuitry in accordance with a number of embodiments of the present disclosure. Performance of the comparison operation using non-linear activation function may include operating sense amplifiers at different reference voltages. The comparison operation may be performed using an aggregated charge and the reference voltage used to implement a threshold.

At block 562, an access command may be received. The access command may be received at a controller of a memory device. The access command may be received from a host.

In some examples, the access command can be accessed from the memory array. For instance, the controller and/or a processing resource local to the memory device hosting the memory array can retrieve and execute instruction from the memory array. The controller and/or the processing resource can retrieve the access command. The access command can be part of a comparison command.

At 564, responsive to receiving the special access command, a reference voltage can be selected. The reference voltage can be selected to set the threshold. The reference voltage can be used to set the threshold which can be used as an activation point for the non-linear activation function of the comparison operation.

At 566, responsive to receiving the access command, the sense line and the plurality of select lines can concurrently be activated to activate a plurality of memory cells. The plurality of memory cells can store a plurality of charges.

At 568, the plurality of charges can be aggregated in a latch of a sense amplifier to generate an aggregate analog charge. The plurality of charges stored in the memory cells can add to the aggregate analog charge or not add to the aggregate analog charge.

At 570, a determination can be made, at the sense amplifier, as to whether the aggregate analog charge is greater than a threshold that is based at least in part on reference voltage. At 572, responsive to determining that the aggregate analog charge is greater than the threshold, a resultant charge can be provided from the sense amplifier. At 574, responsive to determining that the aggregate analog charge is not greater than the threshold, the sensing circuitry may refrain from providing a resultant charge.

The result charge can comprise the aggregate analog charge. The result charge can comprise a charge that is less than the aggregate analog charge. The determination of whether the aggregate analog charge is greater than the threshold can be based at least in part on a comparison with the reference voltage.

In some examples, the charges can be received from the host. The charges can be stored to the memory cells through a write command/write operation. The charges can be stored in the plurality of memory cells coupled to the plurality of select lines and the sense line. The memory cells that store the charges can be selected to align the memory cells to corresponding sense amplifiers.

In some examples, the access command can comprise a first memory address corresponding to a first memory cell and a second memory address corresponding to a second memory cell of the plurality of memory cells. The first memory cell and the second memory cell can be activated by activating select lines corresponding to the first and the second memory cells. The select lines and associated access lines can be activated concurrently to activate the first and second memory cells concurrently.

In some examples, the first memory cell can be activated before the second memory cell. Initially activating the first memory cell before the second memory cell is initially activated can include having the first and second memory cells activated for a shared duration of time. Activating the first memory cell before the second memory cells is activated can include activating a first row line corresponding to the first memory cell before activating a second row line corresponding to the second memory cell. In other examples, the first memory cell and the second memory cell can initially be activated at a same time. Initially activating the first memory cell and the second memory cell at the same time can include activating the first memory cell and the second memory cell for a shared duration of time. The first memory cell and the second memory cell can be deactivated at different times or at a same time.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:
1. An apparatus, comprising:
a memory array comprising:
    a first memory cell coupled to a sense line and to a first select line;
    a second memory cell coupled to the sense line and to a second select line; and sensing circuitry configured to:
    receive a first charge from the first memory cell via the sense line;
    receive a second charge from the second memory cell via the sense line, wherein the first charge and the second charge are received in a duration of time corresponding to a rate of charge leakage from the first memory cell and the second memory cell;
    determine whether an aggregate charge of the first charge and the second charge is greater than a threshold wherein the aggregate charge is stored in a latch of a sense amplifier of the sensing circuitry;

responsive to determining that the aggregate charge is greater than the threshold, provide a third charge; and responsive to determining that the aggregate charge is not greater than the threshold, refrain from providing the third charge.

2. The apparatus of claim 1, wherein the memory array comprises dynamic random-access memory (DRAM).

3. The apparatus of claim 1, wherein the sensing circuitry configured to provide the third charge is further configured to shift the third charge from a first sense amplifier coupled to the sense line to a second sense amplifier coupled to a different sense line.

4. The apparatus of claim 1, wherein the first and the second charges are analog charges.

5. The apparatus of claim 1, wherein the first and the second charges each comprise a signal representation of the charge.

6. A method, comprising:
receiving an access command;
responsive to receiving the access command, selecting a reference voltage;
responsive to receiving the access command, concurrently activating a sense line and a plurality of select lines to activate a plurality of memory cells coupled to the sense line and the plurality of select lines, wherein the plurality of memory cells store a plurality of charges;
aggregating the plurality of charges in a latch of a sense amplifier to generate an aggregate analog charge;
determining at the sense amplifier whether the aggregate analog charge is greater than a threshold that is based at least in part on the reference voltage;
responsive to determining that the aggregate analog charge is greater than the threshold, providing a resultant charge from the sense amplifier; and
responsive to determining that the aggregate analog charge is not greater than the threshold, refraining from providing a resultant charge from the sense amplifier.

7. The method of claim 6, wherein the resultant charge comprises the aggregate analog charge.

8. The method of claim 6, wherein the resultant charge is less than the aggregate analog charge.

9. The method of claim 6, further comprising receiving the plurality of charges from the host.

10. The method of claim 9, further comprising storing the plurality of charges in the plurality of memory cells coupled to the plurality of select lines and the sense line.

11. The method of claim 6, wherein the access command comprises a first memory address corresponding to a first memory cell and a second memory address corresponding to a second memory cell of the plurality of memory cells.

12. The method of claim 11, further comprising activating the plurality of select lines concurrently.

13. The method of claim 12, further comprising activating a first select line from the plurality of select lines before a second select line from the plurality of select lines is activated to activate the first memory cell before the second memory cell.

14. An apparatus, comprising:
a memory array comprising:
a first memory cell coupled to a first sense line and to a first select line, wherein the first memory cell stores a first charge;
a second memory cell coupled to a second sense line and the first select line, wherein the second memory cell stores the second charge;

a controller configured to cause a sense amplifier to:
receive the first charge and a second charge;
determine whether an aggregate charge of the first charge and the second charge is greater than a threshold; and
responsive to determining that the aggregate charge is greater than the threshold, provide a third charge.

15. The apparatus of claim 14, wherein the controller is further configured to cause a different sense amplifier to receive the second charge.

16. The apparatus of claim 15, wherein the controller is further configured to cause the different sense amplifier to shift the second charge to the sense amplifier.

17. The apparatus of claim 16, wherein the controller is further configured to cause the sense amplifier to activate the first sense line and the first select line in concurrence with the shift of the second charge from the different sense amplifier to the sense amplifier.

18. An apparatus, comprising:
a memory array comprising:
a first memory cell coupled to a sense line and to a first select line;
a second memory cell coupled to the sense line and to a second select line;
wherein the memory array is configured to store a third charge; and sensing circuitry configured to:
receive a first charge from the first memory cell via the sense line;
receive a second charge from the second memory cell via the sense line;
determine whether an aggregate charge of the first charge and the second charge is greater than a threshold;
responsive to determining that the aggregate charge is greater than the threshold, provide the third charge to the memory array; and
responsive to determining that the aggregate charge is not greater than the threshold, refrain from providing the third charge.

19. The apparatus of claim 18, wherein the memory array is further configured to store the third charge in a third memory cell coupled to the sense line and the third select line.

20. The apparatus of claim 18, wherein the memory array is further configured to store the third charge in a third memory cell coupled to a different sense line.

21. The apparatus of claim 18, wherein the memory array is further configured to store the third charge in the first memory cell or the second memory cell.

22. An apparatus, comprising:
a memory array comprising:
a first memory cell coupled to a sense line and to a first select line;
a second memory cell coupled to the sense line and to a second select line; and sensing circuitry configured to:
receive a first charge from the first memory cell via the sense line;
receive a second charge from the second memory cell via the sense line wherein the first charge and the second charge are received in a duration of time corresponding to a rate of charge leakage from the first memory cell and the second memory cell;
determine whether an aggregate charge of the first charge and the second charge is greater than a threshold;

responsive to determining that the aggregate charge is greater than the threshold, provide a third charge; and
responsive to determining that the aggregate charge is not greater than the threshold, refrain from providing the third charge.

23. An apparatus, comprising:
   a memory array comprising:
      a first memory cell coupled to a sense line and to a first select line;
      a second memory cell coupled to the sense line and to a second select line; and sensing circuitry configured to:
      receive a first charge from the first memory cell via the sense line;
      receive a second charge from the second memory cell via the sense line wherein the first charge and the second charge are received in a duration of time corresponding to a time dependent dielectric constant relation corresponding to the first memory cell and the second memory cell;
      determine whether an aggregate charge of the first charge and the second charge is greater than a threshold;
      responsive to determining that the aggregate charge is greater than the threshold, provide a third charge; and
      responsive to determining that the aggregate charge is not greater than the threshold, refrain from providing the third charge.

\* \* \* \* \*